(12) United States Patent
Nakajima

(10) Patent No.: US 8,482,321 B2
(45) Date of Patent: *Jul. 9, 2013

(54) INPUT CIRCUIT AND SEMICONDUCTOR INTEGRATED CIRCUIT INCLUDING THE SAME

(75) Inventor: Yuji Nakajima, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/465,956

(22) Filed: May 7, 2012

(65) Prior Publication Data

US 2012/0218007 A1    Aug. 30, 2012

Related U.S. Application Data

(63) Continuation of application No. 13/067,090, filed on May 6, 2011, now Pat. No. 8,193,838, which is a continuation of application No. 12/923,340, filed on Sep. 15, 2010, now Pat. No. 7,969,207, which is a continuation of application No. 12/382,542, filed on Mar. 18, 2009, now Pat. No. 7,834,670.

(30) Foreign Application Priority Data

Mar. 24, 2008    (JP) ................................. 2008-075424

(51) Int. Cl.
  *H01B 1/00*    (2006.01)
(52) U.S. Cl.
  USPC ................................. 327/108; 326/26; 326/82
(58) Field of Classification Search
  None
  See application file for complete search history.

(56) References Cited

U.S. PATENT DOCUMENTS

| | | | |
|---|---|---|---|
| 6,087,885 A | 7/2000 | Tobita | |
| 6,111,431 A | 8/2000 | Estrada | |
| 6,356,141 B1 | 3/2002 | Yamauchi | |
| 6,469,543 B1 | 10/2002 | Fulkerson | |
| 6,515,512 B2 | 2/2003 | Chen | |
| 6,600,346 B1 | 7/2003 | Macaluso | |
| 6,624,670 B2 | 9/2003 | Payne | |
| 6,781,443 B2 | 8/2004 | Hamamoto et al. | |
| 6,873,660 B2 | 3/2005 | Bu | |
| 7,126,377 B2 | 10/2006 | Brooks et al. | |
| 7,176,752 B2 | 2/2007 | Hashimoto et al. | |
| 7,330,056 B1 | 2/2008 | Lu | |
| 7,427,878 B2 * | 9/2008 | Jiang et al. | ...................... 326/83 |
| 7,482,837 B2 | 1/2009 | Fagan | |
| 7,598,780 B2 | 10/2009 | Kibune | |
| 7,750,723 B2 | 7/2010 | Ogiwara et al. | |
| 7,898,295 B1 * | 3/2011 | Kasturirangan et al. | ........ 326/86 |

* cited by examiner

*Primary Examiner* — Tuan T Lam
(74) *Attorney, Agent, or Firm* — McGinn IP Law Group, PLLC

(57) ABSTRACT

An input circuit includes a first differential amplification circuit receiving input from a first power source and an output of a first buffer circuit to output to an input of the first buffer circuit, a second differential amplification circuit receiving input from a second external power source and an output of a second buffer circuit to output to an input of the second buffer circuit, a first resistance coupled between the output of the first differential amplification circuit and the input of the first buffer circuit, and a second resistance coupled between the output of the second differential amplification circuit and the input of the first buffer circuit. The first resistance and the second resistance are arranged at symmetric positions to a node on a signal line from the input signal terminal to the output signal terminal.

20 Claims, 7 Drawing Sheets

INPUT CIRCUIT AND SEMICONDUCTOR INTEGRATED CIRCUIT INCLUDING THE SAME

The present application is a Continuation of U.S. application Ser. No. 13/067,090 filed on May 6, 2011 and patented on Jun. 5, 2012 as U.S. Pat. No. 8,193,838, which is a Continuation Application of U.S. patent application Ser. No. 12/923,340 filed on Sep. 15, 2010 and patented on Jun. 28, 2011 as U.S. Pat. No. 7,969,207, which is a Continuation of U.S. application Ser. No. 12/382,542 filed on Mar. 18, 2009 and patented on Nov. 16, 2010 as U.S. Pat. No. 7,834,670, which is based on Japanese Patent Application No. 2008-075424, filed on Mar. 24, 2008, the entire contents of which is incorporated herein by reference.

BACKGROUND

1. Field of the Invention

The present invention relates to an input circuit. In particular, the present invention relates to an input circuit having an offset voltage adjustment circuit.

2. Description of Related Art

In recent years, semiconductor apparatuses have been required to have a smaller size and reduced power consumption due to an electric signal having a higher speed used in an electronic device and a larger circuit size of the entire semiconductor apparatus used in an electronic device. In accordance with this, reducing the power consumption of a basic circuit configuration of a semiconductor apparatus has been important. In particular, reducing the power consumption of an input circuit including a buffer circuit for handling an analog input signal has been important because such an input circuit is a continuous time processing system.

Such an input circuit is generally inserted between a precedent stage circuit such as an analog input signal source and a subsequent stage circuit such as an analog/digital converter. Such an input circuit has a function to adjust the impedance and offset voltage for the precedent stage circuit and the subsequent stage circuit.

FIG. 1 illustrates a related input circuit. With reference to FIG. 1, an impedance adjustment function will be described. An analog input signal from an input signal terminal 1 is received in a buffer circuit 120. The buffer circuit 120 outputs an output signal to an output signal terminal 5. The input impedance of the buffer circuit 120 is designed to be high and the output impedance thereof is designed to be low. Thus, the input impedance for the output of the precedent stage circuit is high and the output impedance for the input of the subsequent stage circuit is low. With this configuration, it can be prevented that current flows between the output of the precedent stage circuit and the input of the subsequent stage circuit to reduce a signal potential. It can be prevented also that sufficient current is not supplied between the output of the precedent stage circuit and the input of the subsequent stage circuit.

Next, with reference to FIG. 1, an offset voltage adjustment function will be described. This function is used to adjust a center voltage of an output signal level of the precedent stage circuit with a center voltage of an input signal of the subsequent stage circuit. With reference to FIG. 1, an intermediate voltage between the voltage VRT at an external reference voltage terminal 65 and the voltage VRB at an external reference voltage terminal 60 is generated by resistance voltage division. The intermediate voltage is output to the input side of the buffer circuit 120 via a differential amplification circuit 140 and the DC bias the resistance 110. As a result, the center voltage of the output signal terminal 5 is adjusted. When the buffer circuit 120 and the replica buffer circuit 130 have the same voltage gain, then the intermediate voltage value is the same as a center voltage value of a signal output to an output terminal 5. The reason is that, when the voltage gain of the replica buffer circuit 130 is assumed as C, then a voltage C times higher than the output of the differential amplification circuit 140 is input to an inverting input terminal of the differential amplification circuit 140 and thus the output voltage of the differential amplification circuit 140 is 1/C of the intermediate voltage. On the other hand, the voltage of a node 118 is increased by the buffer circuit 120 by a factor of C. Thus, the center voltage of the signal at the output terminal 5 is equal to the intermediate voltage.

The technique as described above is also disclosed in U.S. Pat. No. 7,126,377 for example.

SUMMARY

The present inventors have found a problem that it has now been discovered that the buffer circuit requires three resistances (114, 116, and 110) and thus the power consumption by the resistances is high.

An exemplary aspect of an embodiment of the present invention is an input circuit which includes a first buffer circuit having an output signal terminal connected to an output, a capacitor having one end connected to an input signal terminal, and the other end connected to an input of the first buffer circuit; a first differential amplification circuit receiving a voltage of a first external power source terminal and an output of a second buffer circuit, a second differential amplification circuit receiving a voltage of a second external power source terminal and an output of a third buffer circuit, a first resistance having one end connected to an output of the first differential amplification circuit, and the other end connected between the capacitor and the first buffer circuit, and a second resistance having one end connected to an output of the second differential amplification circuit, and the other end connected between the capacitor and the first buffer circuit. Wherein, an input of the second buffer circuit is connected to the output of the first differential amplification circuit, and an input of the third buffer circuit is connected, to the output of the second differential amplification circuit.

BRIEF DESCRIPTION OF THE DRAWINGS

The above and other exemplary aspects, advantages and feature will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
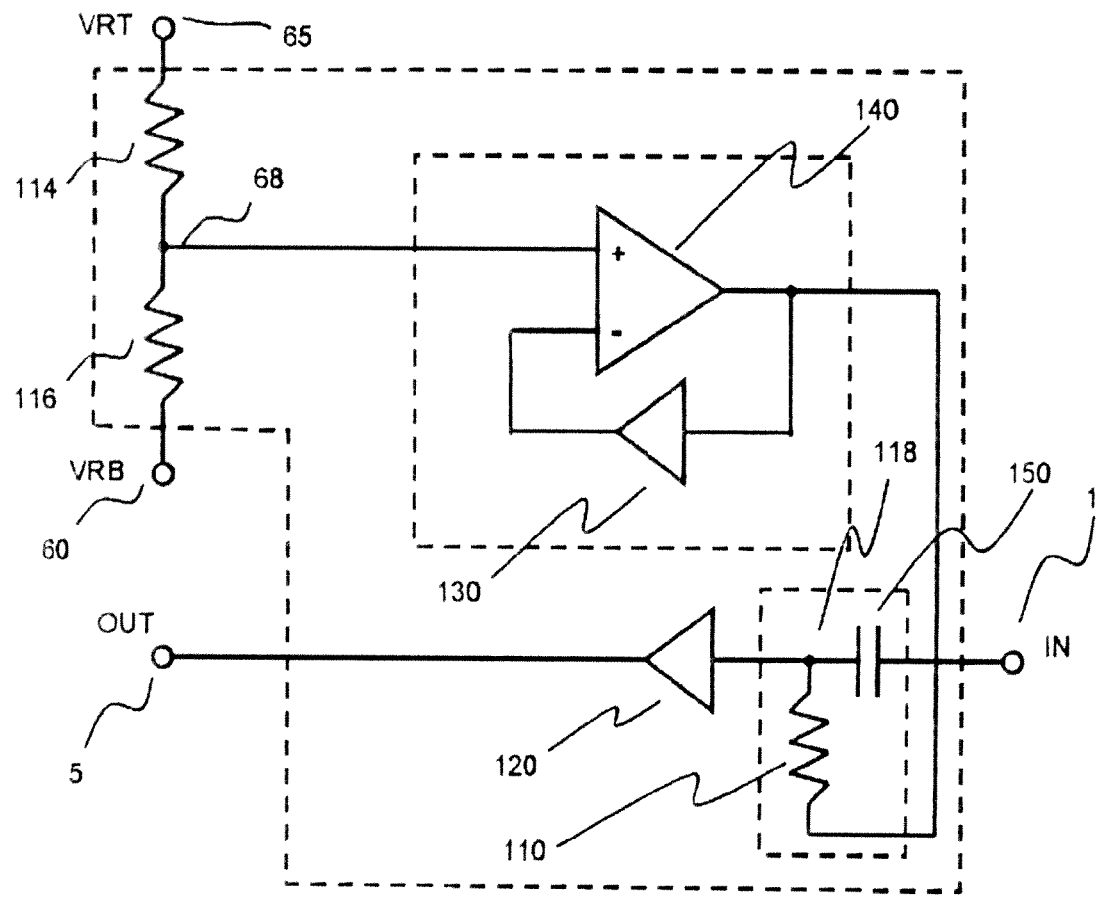
FIG. 1 is a diagram showing a related input circuit.

The first exemplary embodiment of the present invention will be described with reference to FIG. 2. The input circuit of the present invention is structured so that an analog input signal voltage is input to the input signal terminal 1 and the output signal terminal 5 outputs an output signal voltage having an intermediate voltage between the external reference voltages VRT and VRB (=(VRT+VRB)/2) as a center voltage. "The center voltage" means an output signal voltage when an input signal is not input. The output signal is input to an analog/digital (A/D) converter shown in FIG. 3 for example. FIG. 3 illustrates a flash-type A/D converter as an example connect to the output signal terminal 5. The signal output from the input circuit of the present invention is input to the input terminals of the respective comparators 90. Voltage between the external reference voltage VRT and VRB generated by the resistance voltage division is supplied to the other terminals of the respective comparators. The result of comparison by the respective comparators is input to a logical signal processing circuit 94 where the result is converted to a digital signal. This flash-type A/D converter can perform an Analog/Digital conversion for an input signal voltage. This input signal voltage has a voltage range between the external reference voltage VRT and the external reference voltage VRB, and that has a center at the intermediate voltage between the external reference voltages VRT and VRB. Thus, the center voltage of the output signal terminal 5 connected to an input signal terminal 6 is desirably set to be the intermediate voltage between the external reference voltages VRT and VRB.

Next, the configuration of the present invention will be described with reference to FIG. 2. The input signal terminal 1 is connected to one end of a capacitor 50. The other end of the capacitor 50 is connected to a main buffer circuit 20. The output of the main buffer circuit 20 is connected to the output signal terminal 5. The external reference voltage terminal 65 and an external reference voltage terminal 60 are connected to noninverting input terminals of differential amplification circuits 45 and 40, respectively. The outputs of the differential amplification circuits 45 and 40 are connected between the capacitor 50 and the main buffer circuit 20 via DC bias resistances 10 and 15. The outputs of the differential amplification circuits 45 and 40 are also input to replica buffer circuits 35 and 30, respectively. The outputs of the replica buffer circuits 35 and 30 are input to the inverting input terminals of the differential amplification circuits 45 and 40, respectively.

Next, with reference to FIG. 2, the operation of the input circuit of the present invention will be described. A ratio of an output voltage to the input voltage difference between the differential amplification circuits 45 and 40 is assumed as b. A ratio of an output voltage to the input voltages of the main buffer circuit 20 and the replica buffer circuits 35 and 30 (hereinafter referred to as a voltage gain) is assumed as c. The output voltage Vout1 of the differential amplification circuit 45 is established to be Vout1=b·(VRT−(c·Vout1)). That is, Vout1 is nearly VRT/c. Similarly, an output voltage Vout2 of the differential amplification circuit 40 is nearly VRB/c. Here, 1/b is assumed to be 0.

Thus, when the DC bias resistances 10 and 15 have the same resistance value, the voltage of a node 18 is to be (Vout1+Vout2)/2=(VRT+VRB)/2c. Thus, the voltage of the output signal terminal 5 is to be c·((VRT+VRB)/2c))=(VRT+VRB)/2. Thus, the intermediate voltage between the external reference voltages VRT and VRB is output.

The replica buffer circuits 35 and 30 desirably have the same voltage gain as that of the main buffer circuit 20. For example, the replica buffer circuits 35 and 30 may have the same circuit configuration as that of the main buffer circuit 20. When the replica buffer circuits 35 and 30 have the same voltage gain as that of the main buffer circuit 20, an output signal having center voltage made by the resistance voltage division between the external reference voltages VRT and VRB with using DC bias resistance 10 and 15 can be generated. When the replica buffer circuits 35 and 30 have a different voltage gain from that of the main buffer circuit 20, the ratio of the resistance value of the DC bias resistance 10 and 15 can be changed to adjust the center voltage.

For example, when assuming that the main buffer circuit 20 has a voltage gain C1, the replica buffer circuits 35 and 30 have a voltage gain C2, and the ratio between the resistance values the DC bias resistances 10 and 15 is $\alpha$, then the voltage of the node 18 is $(\alpha \cdot VRB+VRT)/(1+\alpha)/C2$. Thus, the voltage of the output signal terminal 5 is $(\alpha \cdot VRB+VRT)/(\alpha+1) \cdot C1/C2$. When this voltage is to be (VRT+VRB)/2, $\alpha=(C2/C1 \cdot (VRT+VRB)/2-VRT)/(VRB-C2/C1 \cdot (VRT+VRB)/2)$ needs to be satisfied. With the resistance ratio as described above, the voltage of (VRT+VRB)/2 can be obtained as an output voltage even when C1 and C2 are not equal.

Next, a mechanism will be described in which the first exemplary embodiment of the present invention having the same chip size provides lower power consumption when compared with the circuit of FIG. 1.

Figure 7:
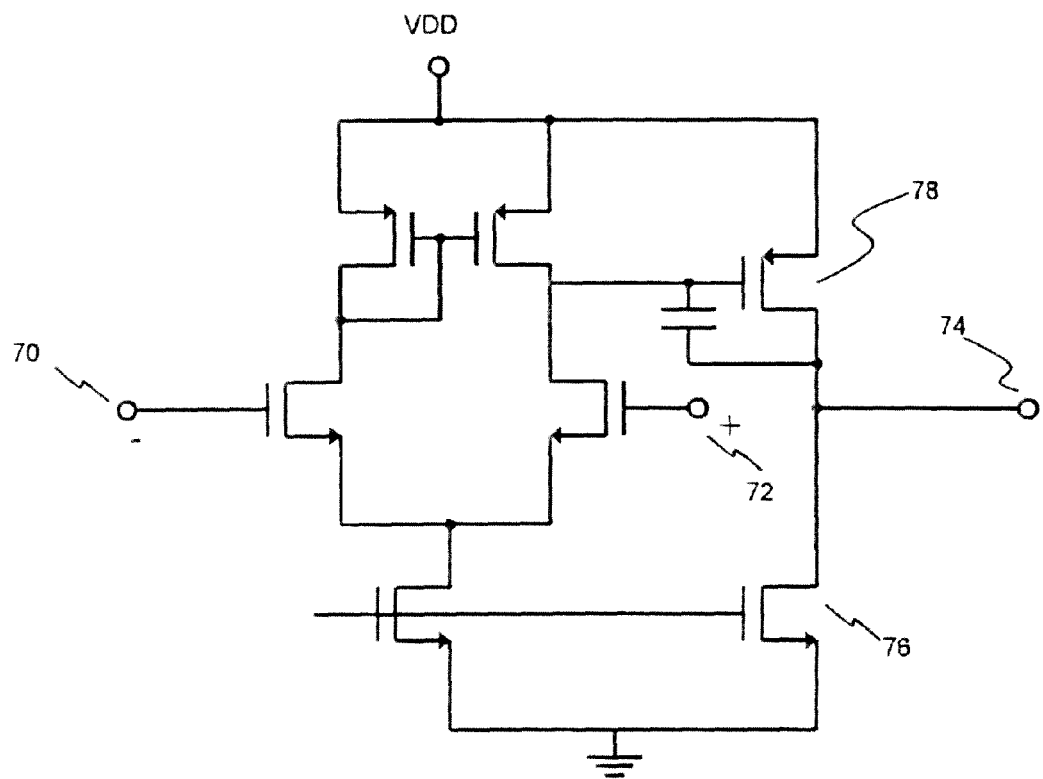
FIG. 7 is a diagram showing examples of the differential amplification circuits.

Here, the output impedances of the differential amplification circuit 140 and the differential amplification circuits 45 and 40 for the node 118 and the node 18 are set to be equal. FIG. 7 illustrates examples of the differential amplification circuits 140, 45, and 40. In the circuit shown in FIG. 7, an input signal is input to the inverting input terminal 70 and the noninverting input terminal 72 and a signal subjected to a differential amplification is output to an output terminal 74.

The output impedance Rout in the output terminal 74 is calculated based on Rout=R1//R2. Here, R1 and R2 represent an output impedance between the source and the drain of a PMOS transistor 78 and an NMOS transistor 76. R1 and R2 can be calculated by a square-law characteristic formula for the gate voltage of the drain current in the MOS transistor. The drain current Id is given by $Id=1/2 \cdot \mu \cdot Cox \cdot (W/L) \cdot (Vgs-Vth)^2 \cdot (1+\lambda \cdot Vds)$. Here, $\mu$ represents an electronic mobility, Cox represents a unit capacity, W represents a gate width, L represents a gate length, Vgs−Vth represents an effective gate voltage, and Vds represents a voltage between a source and a drain. $\lambda$ represents a coefficient of Vds in a saturation region. Here, output impedances R1 and R2 are given by $\partial Vds/\partial Id$.

Based on the above, the output impedances R1 and R2 are found as $R1=1/(\lambda p \cdot Id)$ and $R2=1/(\lambda n \cdot Id)$, respectively. Here, $\lambda$ of PMOS transistor is assumed as $\lambda p$ and $\lambda$ of NMOS transistor is assumed as $\lambda n$. From these formulae, the output impedance Rout of the differential amplification circuit is consequently $Rout=1/(\lambda p \cdot Id+\lambda n \cdot Id) \propto 1/Id$.

In order to provide the same output impedance of the differential amplification circuits for the node 18 and the node 118, the resistance value R of the resistance 110 may be equal to the total resistance values of the resistance 10 and the resistance 15 and the total output impedances of the differential amplification circuits 45 and 40 may be equal to the output impedance of the differential amplification circuit 140.

Since Rout∝1/Id is established, drain current Id of the differential amplification circuits 45 and 40 is a half of the drain current Id the differential amplification circuit 140. This means that, when the same current density is used to operate the differential amplification circuits 45 and 40 and the differential amplification circuit 140, the gate widths of the differential amplification circuits 45 and 40 may be a half of the gate width of the differential amplification circuit 140. Similarly, the current and the gate width of the replica buffer circuits 35 and 30 may be a half of the current and the gate width of the replica buffer circuit 130.

Figure 2:
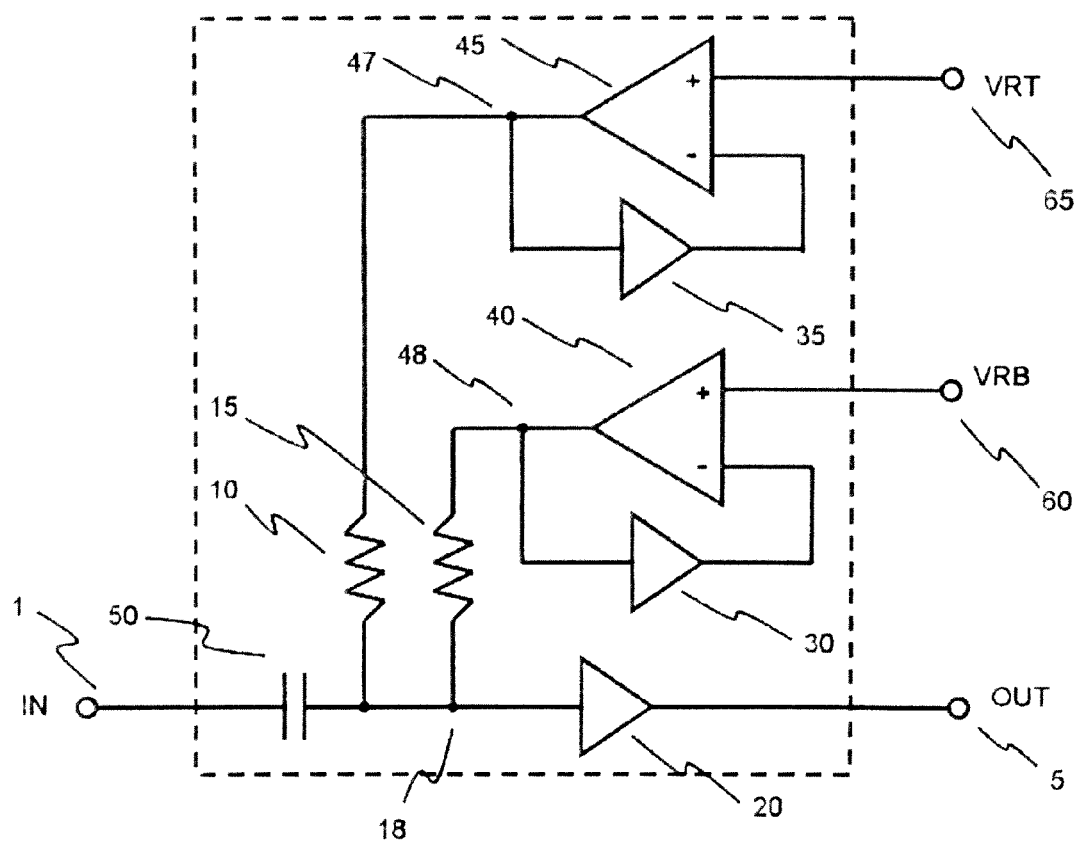
FIG. 2 is a diagram showing an input circuit according to the first exemplary embodiment of the present invention.
Figure 3:
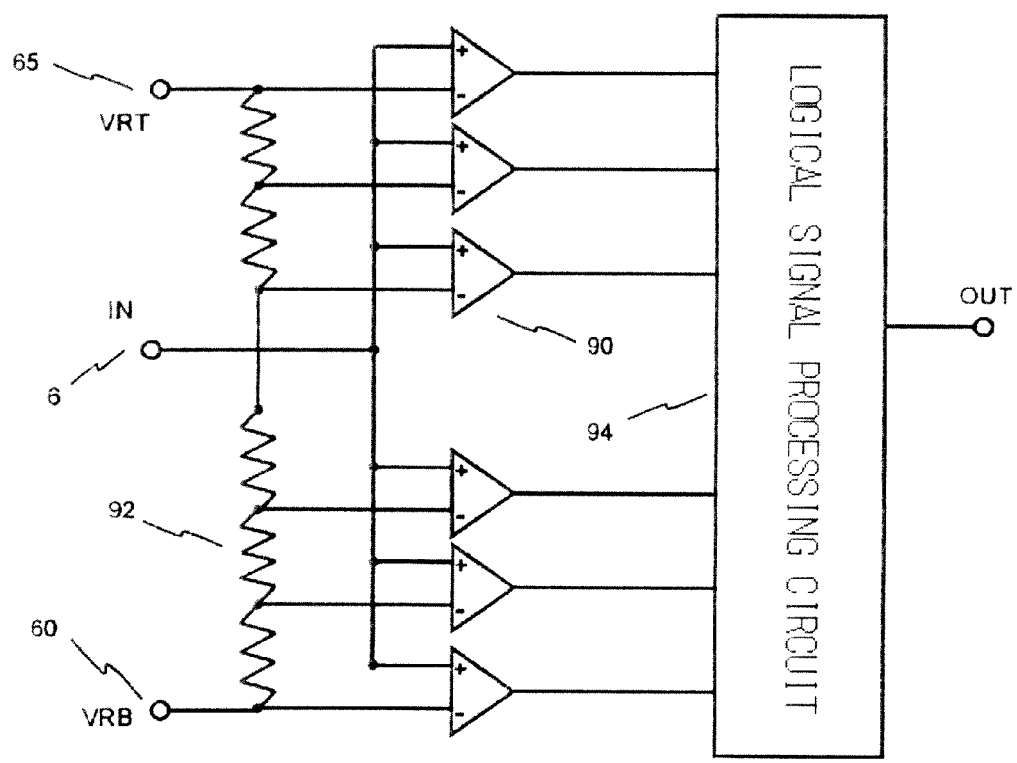
FIG. 3 is a diagram showing a flash-type A/D converter of the input circuit according to the first exemplary embodiment of the present invention.

From the above, the total drain current of the differential amplification circuits 45 and 40 of FIG. 2 is the same as the drain current of the differential amplification circuit of FIG. 1. Thus, an equal power consumption is achieved. Similarly, the total power consumption of the replica buffer circuits 35 and 30 is also equal to the power consumption of the replica buffer circuit 130. The total gate width of the differential amplification circuits 45 and 40 of FIG. 2 is equal to the gate width of the differential amplification circuit 140 of FIG. 1. The total gate width of the replica buffer circuits 35 and 30 of FIG. 2 is equal to the gate width of the replica buffer circuit 130. Thus, in FIG. 1 and FIG. 2, the differential amplification circuit and the replica buffer circuit occupy substantially the same area in the layout.

In order to allow a resistance value R of resistance 110 to be equal to the total resistance values of resistance 10 and resistance 15, the resistance values of the resistances 10 and 15 may be 2R.

Since a size of resistance is roughly proportional to a resistance value, in order to achieve the same chip size (i.e., the same resistance area), the total resistance value may be at the same level in FIG. 1 and FIG. 2. Since the total resistance values of FIG. 2 is calculated by 2·2R=4R, in order to similarly allow the total of the resistance values of FIG. 1 to be 4R, the resistance value of each of the resistances 114 and 116 is 3R/2, respectively.

In this case, the total of the power consumed by the resistance of FIG. 1 can be calculated in the manner as described below. It is assumed that VRT−VRB=2Vr is established and an input signal amplitude voltage is Vs.

The power consumption at the resistances 114 and 116 is found as $(2Vr)2/(2·3R/2)=4Vr2/3R$. The power consumption at the DC bias the resistance 110 on the other hand is found as $Vs2 \sin 2 (\omega t)/R$ because the voltage applied to the DC bias the resistance 110 can be written to be $Vs·\sin(\omega t)$. With a time average method, it can be found as $Vs2/2R$ at the DC bias the resistance 110. Thus, the total power consumption by the resistance of the circuit of FIG. 1 is $4Vr2/3R+Vs2/2R$.

On the other hand, the power consumption at the resistance in the circuit of FIG. 2 will be considered. The output voltages of the differential amplification circuits 45 and 40 based on the node 18 as a reference are Vr/c and −Vr/c. Thus, the voltages applied to the DC bias resistances 10 and 15 are $(Vr/c−Vs·\sin(\omega t))$ and $(Vr/c+Vs·\sin(\omega t))$. The total power consumption of the DC bias resistances 10 and 15 is $(Vr/c+Vs·\sin(\omega t))/2R+(Vr/c−Vs·\sin(\omega t)) 2/2R=[(Vr/c)2+Vs2 \sin 2 (\omega t)]/R$. With a time average method, the power consumption can be found as $Vr2/c2R+Vs2/2R$. Here, $Vs2/2R$ corresponds to the power consumption of the current flowed to the DC bias resistances 10 and 15 by the input signal voltage. $Vr2/c2R$ corresponds to the power consumption of the current flowing as DC current to the DC bias resistances 10 and 15.

As can be seen from these results, the circuit of FIG. 2 has power consumption smaller by $4Vr2/3R−Vr2/c2R=(Vr2/R)·(4/3−1/c2)$. In other words, when a replica buffer circuit has a voltage gain equal to or higher than √3/2 (which is nearly equal to 0.36), the exemplary embodiment of the present invention provides lower power consumption.

Another effect is also obtained. That is, the external reference voltage terminals 65 and 60 are connected to the differential input circuits 45 and 40 having high input impedance and thus substantially no current flows in an external reference voltage. In the related example shown in FIG. 1, the resistances 111 and 116 are connected between the external reference voltage terminals 65 and 60 in order to obtain an intermediate voltage. Thus, current flows between the external reference voltage terminals 65 and 60 via the resistances 114 and 116. In the case, some current flows between the external reference voltage terminals 65 and 60, and the total value of this current and current flowing between the external reference voltage terminals 65 and 60 by another circuit (e.g., FIG. 3) may exceed a predetermined current value. As a result, it causes a disadvantage such as a variation in the external reference voltage for example.

Figure 4:
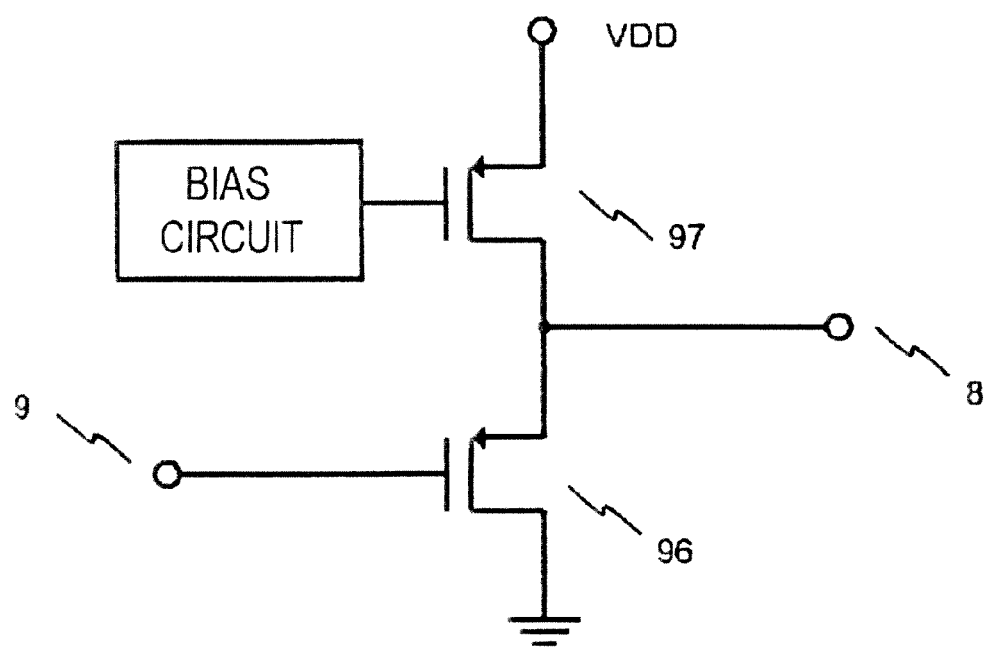
FIG. 4 is a diagram showing a main buffer circuit and replica buffer circuits of the input circuit according to the first exemplary embodiment of the present invention.

FIG. 4 illustrates an example of the circuit of the present invention of the main buffer circuit 20 and replica buffer circuits 30 and 35. In the case of the main buffer circuit 20, an input terminal 9 is connected to the node 18 and an output terminal 8 is connected to the output signal terminal 5. In the case of a replica buffer circuit, a terminal 9 is connected to the output terminals of the differential input circuits 45 and 40 and the output terminal 8 is connected to the inverting input terminals of the differential input circuits 45 and 40. The circuit of FIG. 4 has a source follower circuit configuration and the output terminal 8 connected to a source of a PMOS transistor 96. A gate of the PMOS transistor 97 is connected to a bias circuit and a predetermined voltage is supplied to the gate. Thus, the gate of the PMOS transistor 97 operates as a constant current source. The use of the source follower circuit in the circuit of FIG. 4 provides advantages of a low output impedance and a high current driving capability.

Second Exemplary Embodiment

Figure 5:
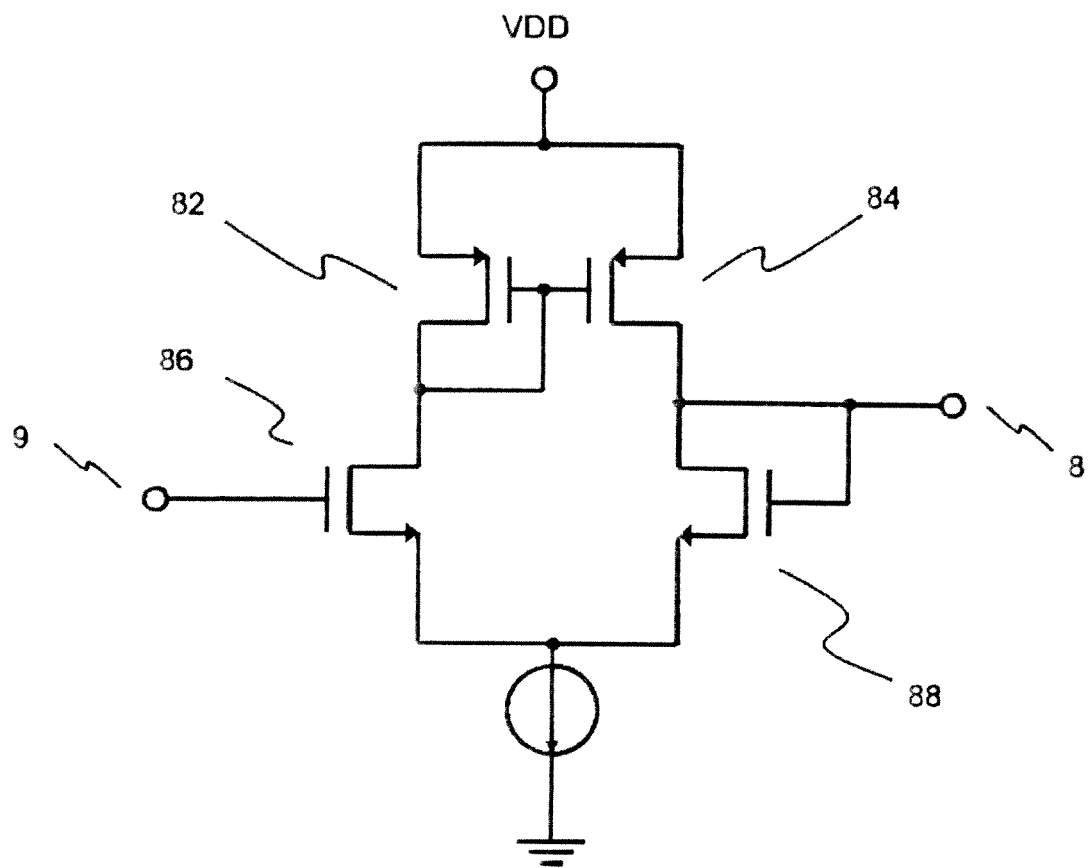
FIG. 5 is a diagram showing a main buffer circuit and a replica buffer circuit of the second exemplary embodiment of the present invention.

FIG. 5 illustrates a main buffer circuit and a replica buffer circuit of the second exemplary embodiment of the present invention. With reference to FIG. 5, the circuit configuration will be described. Sources of PMOS transistors 82 and 84 are connected to a power source voltage VDD and a gate is connected to a drain of the PMOS transistor 82. The drain of the PMOS transistor 82 is connected to the drain of the NMOS transistor 86 and the gate is connected to the input the terminal 9. The drain of the PMOS transistor 84 is connected to the output terminal 8 and is also connected to a gate of an NMOS transistor 88. The gate of the NMOS transistor 88 is connected to the output terminal 8 and the source thereof and the source of the NMOS transistor 88 are connected to a constant current source.

In the main buffer circuit and the replica buffer circuit of the second exemplary embodiment of the present invention, an input signal voltage input to the input the terminal 9 is applied between the gate and the source of the NMOS transistor 86 and drain current flows in accordance with the voltage between the gate and the source. Current having the same value as that of this drain current flows to the drain of the PMOS transistor 84 by the PMOS transistors 82 and 84 constituting a current mirror circuit. The drain current of the PMOS transistor 84 flows between the drain and the source of the NMOS transistor 88 and a gate voltage depending on the current value is output to the output terminal 8.

In the main buffer circuit and the replica buffer circuit of the second exemplary embodiment of the present invention, the input-side NMOS transistor 86 is separated from the output-side NMOS transistor 88 to isolate the input from the output. This suppresses an output impedance of a precedent stage circuit connected to the input the terminal 9 and an input impedance of a subsequent stage circuit connected to the output terminal 8 from interfering each other. Thus, even when the subsequent stage circuit has a low input impedance to flow current, the current at the output-side of the precedent stage circuit does not change. Thus, a new effect can be obtained according to which a disadvantage such as a reduced signal voltage due to increased current can be prevented.

Third Exemplary Embodiment

Figure 6:
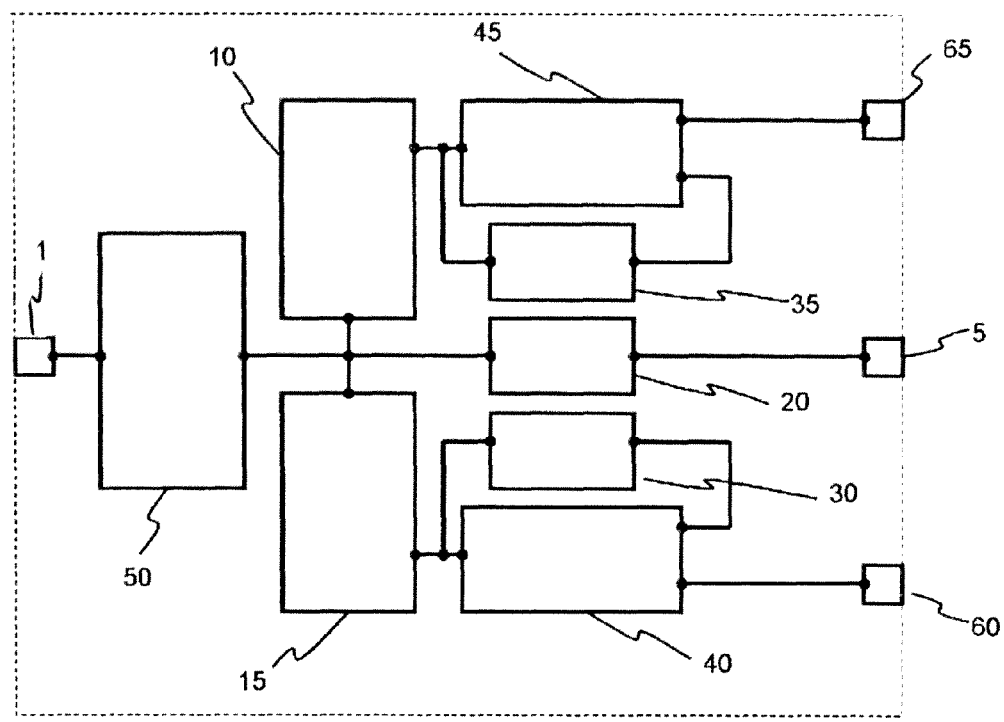
FIG. 6 is a diagram showing a layout pattern according to the third exemplary embodiment.

FIG. 6 is a layout pattern diagram illustrating the third exemplary embodiment. FIG. 6 is a schematic view illustrating a layout pattern of the circuit of FIG. 2. In FIG. 6, the connecting relation among the respective blocks is shown by lines schematically illustrating the connecting relation of wirings. In an actual case, a mask pattern is prepared with a predetermined wiring width. The third exemplary embodiment is characterized in that the main buffer circuit 20 and the replica buffer circuits 35 and 30 are arranged so as to be adjacent to one another. The resistances 10 and 15 for DC buffer are also arranged so as to be adjacent to each other.

The main buffer circuit 20 and the replica buffer circuits 35 and 30 arranged so as to be adjacent to one another can minimize the influence by the variation in the voltage gains due to the variation in a wafer plane of a transistor. The resistances 10 and 15 for DC buffer also arranged so as to be adjacent to each other can minimize the influence by the variation in a resistance value due to the variation in the wafer plane. Thus, a new effect can be obtained according to which variation of a center voltage of a buffer circuit due to process variation can be suppressed.

When the replica buffer circuits 35 and 30 are arranged at symmetric positions to the main buffer circuit 20 as shown in FIG. 6, the distance between the main buffer circuit 20 and the replica buffer circuits 35 and 30 is reduced. Thus, the variation in the voltage gain due to the variation in the wafer plane can be further suppressed to further suppress the center voltage of the buffer circuit from being dislocated.

The first, second and third exemplary embodiments can be combined as desirable by one of ordinary skill in the art.

While the invention has been described in terms of several exemplary embodiments, those skilled in the art will recognize that the invention can be practiced with various modifications within the spirit and scope of the appended cairns and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed:

1. An input circuit, comprising:
   a first buffer circuit;
   a second buffer circuit;
   a third buffer circuit;
   a first differential amplification circuit that includes a first input coupled to a first external power source terminal, a second input coupled to an output of the first buffer circuit, and an output coupled to an input of the first buffer circuit;
   a second differential amplification circuit that includes a first input coupled to a second external power source terminal, a second input coupled to an output of the second buffer circuit, and an output coupled to an input of the second buffer circuit; and
   a first resistance that includes one end coupled to the output of the first differential amplification circuit, and another end coupled between an input signal terminal of the input circuit and the input of the third buffer circuit; and
   a second resistance that includes one end coupled to the output of the second differential amplification circuit, and another end coupled between the input signal terminal of the input circuit and the input of the third buffer circuit,
   wherein the first resistance and the second resistance are arranged at symmetric positions to a node on a signal line from the input signal terminal to an output signal terminal of the input circuit.

2. The input circuit according to claim 1, wherein the third buffer circuit includes an output coupled to the output signal terminal of the input circuit, and an input coupled to an input signal terminal of the input circuit, and
   wherein the first and second buffer circuits are arranged at symmetric positions to the third buffer circuits.

3. The input circuit according to claim 1, wherein the first buffer circuit comprises:
   a first MOS (Metal-Oxide-Semiconductor) transistor including a gate coupled to the output of the first differential amplification circuit; and
   a second MOS transistor including a gate coupled to a bias circuit.

4. The input circuit according to claim 1, wherein the second buffer circuit comprises:
   a first MOS transistor including a gate coupled to the output of the second differential amplification circuit; and
   a second MOS transistor including a gate coupled to a bias circuit.

5. The input circuit according to claim 1, wherein the third buffer circuit comprises:
   a first MOS transistor including a gate coupled to the input signal terminal; and
   a second MOS transistor including a gate coupled to a bias circuit.

6. The input circuit according to claim 1, wherein the first buffer circuit includes:
   a current mirror circuit;
   a third MOS transistor including a gate coupled to the output of the first differential amplification circuit; and
   a fourth MOS transistor including a gate coupled to the second input of the first differential amplification circuit.

7. The input circuit according to claim 1, wherein the second buffer circuit includes:
   a current mirror circuit;
   a third MOS transistor including a gate coupled to the output of the second differential amplification circuit; and
   a fourth MOS transistor including a gate coupled to the second input of the second differential amplification circuit.

8. The input circuit according to claim 1, wherein the third buffer circuit includes:
   a current mirror circuit;
   a third MOS transistor including a gate coupled to the input signal terminal; and
   a fourth MOS transistor including a gate coupled to the output signal terminal.

9. The input circuit according to claim 1, wherein the output signal terminal of the input circuit is coupled to an A/D (analog to digital) converter.

10. The input circuit according to claim 1, wherein the input signal terminal of the input circuit is configured to receive an analog input signal.

11. An input circuit, comprising:
a first buffer circuit;
a second buffer circuit;
a third buffer circuit;
a first differential amplification circuit that receives a first input from a first external power source, a second input that receives an output of the first buffer circuit, the first differential amplification circuit outputs to an input of the first buffer circuit;
a second differential amplification circuit that receives a first input from a second external power, a second input receives an output of the second buffer circuit, and an output is provided an input of the second buffer circuit; and
a first resistance that includes one end receiving the output of the first differential amplification circuit, and another end connected with an input signal terminal of the input circuit and the input of the third buffer circuit; and
a second resistance that includes one end receiving the output of the second differential amplification circuit, and another end connected with the input signal terminal of the input circuit and the input of the third buffer circuit.

12. The input circuit according to claim 11, wherein the first resistance and the second resistance are arranged at symmetric positions to a node on a signal line from the input signal terminal to an output signal terminal of the input circuit.

13. The input circuit according to claim 11, wherein the third buffer circuit includes an output coupled to an output signal terminal of the input circuit, and an input coupled to an input signal terminal of the input circuit, and
wherein the first and second buffer circuits are arranged at symmetric positions to the third buffer circuits.

14. The input circuit according to claim 11, wherein the first buffer circuit comprises:
a first transistor controlled by the output of the first differential amplification circuit; and
a second transistor controlled by a bias circuit.

15. The input circuit according to claim 11, wherein the second buffer circuit comprises:
a first transistor controlled by the output of the second differential amplification circuit; and
a second transistor controlled by a bias circuit.

16. The input circuit according to claim 11, wherein the third buffer circuit comprises:
a first transistor controlled by a signal from the input signal terminal; and
a second transistor controlled by a bias circuit.

17. The input circuit according to claim 11, wherein the first buffer circuit includes:
a current mirror circuit;
a third transistor controlled by the output of the first differential amplification circuit; and
a fourth transistor controlled by the second input of the first differential amplification circuit.

18. The input circuit according to claim 11, wherein the second buffer circuit includes:
a current mirror circuit;
a third transistor controlled by the output of the second differential amplification circuit; and
a fourth transistor controlled by the second input of the second differential amplification circuit.

19. The input circuit according to claim 11, wherein the third buffer circuit includes:
a current mirror circuit;
a third transistor controlled by the input signal terminal; and
a fourth transistor controlled by the output signal terminal.

20. The input circuit according to claim 11, wherein an output signal terminal of the input circuit is coupled to an A/D (analog to digital) converter, and
wherein the input signal terminal of the input circuit is configured to receive an analog input signal.

* * * * *